United States Patent
Gouin et al.

(10) Patent No.: US 10,431,979 B2
(45) Date of Patent: Oct. 1, 2019

(54) METHOD AND SYSTEM FOR DETERMINING THE STRUCTURE OF AN ELECTRICITY TRANSMISSION GRID AND ASSOCIATED COMPUTER PROGRAM

(71) Applicant: Schneider Electric Industries SAS, Rueil-Malmaison (FR)

(72) Inventors: Victor Gouin, Gieres (FR); Marie-Cecile Alvarez-Herault, Grenoble (FR); Philippe Deschamps, Le Pont de Claix (FR); Sylvain Marie, Grenoble (FR); Yacine Lamoudi, Grenoble (FR)

(73) Assignee: SCHNEIDER ELECTRIC INDUSTRIES SAS, Rueil-Malmaison (FR)

( * ) Notice: Subject to any disclaimer, the term of this patent is extended or adjusted under 35 U.S.C. 154(b) by 268 days.

(21) Appl. No.: 15/096,521

(22) Filed: Apr. 12, 2016

(65) Prior Publication Data
US 2016/0315469 A1  Oct. 27, 2016

(30) Foreign Application Priority Data
Apr. 23, 2015 (FR) ...................... 15 53646

(51) Int. Cl.
*H02J 3/00* (2006.01)
*G01R 19/25* (2006.01)

(52) U.S. Cl.
CPC ............ *H02J 3/00* (2013.01); *G01R 19/2513* (2013.01); *Y04S 20/322* (2013.01); *Y04S 20/48* (2013.01); *Y04S 40/164* (2013.01)

(58) Field of Classification Search
None
See application file for complete search history.

(56) References Cited

U.S. PATENT DOCUMENTS

2004/0263147 A1    12/2004  Piesinger
2006/0085346 A1*    4/2006  Riley ................. H04L 41/12
                                                          705/51
(Continued)

FOREIGN PATENT DOCUMENTS

DE    10 2008 044 915 A1    3/2010
EP         2 458 340 A2     5/2012
(Continued)

OTHER PUBLICATIONS

French Preliminary Search Report dated Mar. 14, 2016 in French Application 15 53646, filed on Apr. 23, 2015 ( with English Translation of Categories of Cited Documents).

*Primary Examiner* — John C Kuan
(74) *Attorney, Agent, or Firm* — Oblon, McClelland, Maier & Neustadt, L.L.P.

(57) ABSTRACT

A method is provided for determining the structure of an electricity transmission grid, including a power supply station including one or more feeders for supplying electrical power to a plurality of electricity consumers, the method including acquiring first data relating to the electrical power consumed by each consumer during various time intervals; acquiring second data relating to the electrical power delivered by each feeder during the various time intervals; generating a plurality of different classes of data; calculating a first selection criteria for each class of data; selecting a first set of classes of data from the classes generated; and determining connection parameters.

14 Claims, 4 Drawing Sheets

(56) References Cited

U.S. PATENT DOCUMENTS

| | | |
|---|---|---|
| 2007/0005277 A1 | 1/2007 | Bickel et al. |
| 2007/0014313 A1 | 1/2007 | Bickel et al. |
| 2008/0243405 A1 | 10/2008 | Iwane |
| 2009/0066528 A1 | 3/2009 | Bickel et al. |
| 2010/0007219 A1 | 1/2010 | De Buda et al. |
| 2010/0134089 A1 | 6/2010 | Uram et al. |
| 2010/0164473 A1 | 7/2010 | Caird |
| 2010/0306151 A1 | 12/2010 | Bickel et al. |
| 2011/0028813 A1 | 2/2011 | Watson et al. |
| 2011/0184576 A1 | 7/2011 | Hasan et al. |
| 2011/0210717 A1 | 9/2011 | Hilton et al. |
| 2012/0136638 A1 | 5/2012 | Deschamps et al. |
| 2014/0032144 A1* | 1/2014 | Kussyk ............... H02J 13/0006 702/64 |

FOREIGN PATENT DOCUMENTS

| | | |
|---|---|---|
| WO | WO 2009/061291 A1 | 5/2009 |
| WO | WO 2012/113936 A1 | 8/2012 |

\* cited by examiner

METHOD AND SYSTEM FOR DETERMINING THE STRUCTURE OF AN ELECTRICITY TRANSMISSION GRID AND ASSOCIATED COMPUTER PROGRAM

The present invention relates to a method implemented by computer, for determining the structure of an electricity transmission grid, an associated computer program and a system for determining the structure of the electricity transmission grid.

In the field of electricity transmission, it is known to provide electricity transmission to a plurality of electricity consumers via an electricity transmission grid comprising an electricity transformer station, the station comprising electrical feeders for supplying electrical power to electricity consumers. The transformer station is, for example, a high voltage/medium voltage (HV/MV) or medium voltage/low voltage (MV/LV) transformer station and the electrical feeders are medium or low voltage feeders.

High voltage corresponds to a voltage greater than 50 kVolts (kV), medium voltage corresponds to a voltage between 1 kV and 50 kV and low voltage corresponds to a voltage less than 1 kV.

In such electricity transmission grids, the consumers are supplied either in three-phase, or in single-phase, and the transformer station is configured for distributing the electrical power that it receives between the various electrical feeders.

However, the structure, and more precisely the mapping, of the electricity transmission grids supplying the electricity consumers is generally poorly known. But knowledge of the structure of such grids has become essential for meeting the constraints that national regulators impose on electricity transmission firms, notably in terms of quality of electricity supply.

Indeed, national regulators impose quality of service objectives on electricity transmission firms, and these must be measurable. Electricity transmission firms henceforth therefore need to be better acquainted with the structure of electricity transmission grids, notably for locating possible faults or failures on the grid or for identifying the feeders of the transformer station most contributing to electrical losses.

Thus a method is known from EP 2 458 340 A2 for determining the structure of an electricity transmission grid from specific calculation means and information relating to the electrical power consumed by each electricity consumer connected to the grid and relating to the electrical power delivered by each feeder from the transformer station.

However, the speed of execution, accuracy, and reliability of such a method remain to be improved.

The object of the invention is therefore to provide a robust method for determining the structure of an electricity transmission grid making it possible to determine the structure of the electricity transmission grid in a safer, more reliable and faster way. Such a method notably makes it possible to overcome errors, e.g. related to inaccuracies in measuring the power consumed and/or delivered or to the absence of some energy measurements.

For this purpose, the subject matter of the invention is a method for determining the structure of an electricity transmission grid, the method being implemented by computer, the transmission grid comprising a power supply station comprising one or more feeders for supplying electrical power to a plurality of electricity consumers and comprising the following steps:

a) acquiring, for each electricity consumer, first data relating to the electrical power consumed by the electricity consumer during various time intervals, measured via a first sensor for measuring power, b) acquiring, for each feeder, second data relating to the electrical power delivered by the feeder during various time intervals, measured via a second sensor for measuring power, c) generating, via a generating module, a plurality of different classes of data, each associated with one of the time intervals, each class of data comprising the first and second data associated with said time interval, characterized in that the method further comprises the following steps:

d) calculating a first selection criterion for each class of data, the first selection criterion being a criterion chosen from an overall rate of electrical power losses between the feeder or feeders and the consumers and a difference in consumption of electrical power between the various consumers, e) selecting, by a selection unit and on the basis of the first selection criteria calculated, a first set of classes of data from the classes generated, f) determining, from the first selected set, connection parameters, said parameters comprising for each electricity consumer an identifier of the feeder to which it is connected.

Thanks to the invention, the steps of selecting the first set of classes of data on the basis of the first selection criteria calculated and of determining the connection parameters from the first selected set make it possible to determine the structure of the electricity transmission grid in a more reliable and faster way.

According to other advantageous aspects of the invention, the method of determination further comprises one or more of the following features, taken in isolation or according to all the technically acceptable combinations:

during the calculating step d), a second selection criterion is calculated for each class of data generated, the second criterion being the other criterion chosen from an overall rate of electrical power losses between the feeder or feeders and the consumers and a difference in consumption of electrical power between the various consumers, and, during the selecting step e), the first set is selected on the basis of the first and second criteria calculated;

following the selecting step e), the method comprises the following steps:

e1) calculating a second selection criterion for each class of data of the first set, the second criterion being the other criterion chosen from an overall rate of electrical power losses between the feeder or feeders and the consumers and a difference in consumption of electrical power between the various consumers, e2) selecting on the basis of the second selection criteria calculated, a second set of classes of data from the first set, determining the connection parameters then being performed during the determining step f) on the basis of the second set selected from the first set;

during the determining step f), the connection parameters are determined separately for each feeder and independently of the second data relating to the electrical power acquired for the other feeders;

during the determining step f), an equation system to be solved is determined from a premise of conservation of electrical power for each feeder according to which the power delivered by the feeder is substantially equal to the sum of the power consumed by the electricity consumers connected to the feeder and the electrical losses;

during the determining step f), the equation system is defined from the following equation:

$$E_{Dj}(t_k) = \sum_{i=1}^{n} (a_{ij} \cdot E_{Ci}(t_k) + \partial 1_{jk} - \partial 2_{jk}),$$

where n is the number of electricity consumers, j is a feeder index varying from 1 to m, m being the number of feeders, i is an electricity consumer index varying from 1 to n, k is a class of data index of the first set varying from 1 to w, w being the number of classes of data of the first set, $t_k$ is the time interval associated with the class of data of index k, $a_{ij}$ is the connection parameter indicating whether the consumer of index i is connected to the feeder of index j, $E_{Ci}(t_k)$ is the electrical power consumed by the electricity consumer of index i during the time interval $t_k$, $E_{Dj}(t_k)$ is the electrical power delivered by the feeder of index j during the time interval $t_k$, and $\partial 1_{jk}$ and $\partial 2_{jk}$ are adjustment variables representative of the electrical losses;

the equation system is written in matrix form as follows: A*z=B, where $$z = \begin{bmatrix} a_{11} \\ \vdots \\ a_{n1} \\ \vdots \\ a_{1m} \\ \vdots \\ a_{nm} \\ \partial 1_{11} \\ \vdots \\ \partial 1_{mw} \\ \partial 2_{11} \\ \vdots \\ \partial 2_{mw} \end{bmatrix},$$

$$B = \begin{bmatrix} E_{D1}(t_1) \\ \vdots \\ E_{D1}(t_w) \\ E_{D2}(t_1) \\ \vdots \\ E_{D2}(t_w) \\ E_{Dm}(t_1) \\ \vdots \\ E_{Dm}(t_k) \end{bmatrix}$$

and $$A = \begin{bmatrix} U & 0 & \cdots & 0 \\ 0 & \ddots & \ddots & \vdots \\ \vdots & \ddots & \ddots & 0 \\ 0 & \cdots & 0 & U \end{bmatrix}$$

with $$U = \begin{bmatrix} E_{C1}(t_1) & \cdots & E_{Cn}(t_1) \\ \vdots & \ddots & \vdots \\ E_{C1}(t_w) & \cdots & E_{Cn}(t_w) \end{bmatrix}$$

and A comprising m*n columns and m*w rows;

during the determining step, an optimization algorithm is used for solving the equation system, the optimization algorithm verifying:

$$\min_z f^T \cdot z$$

such that $$\begin{cases} A \cdot z = B \\ 1_z \leq z \leq u_z \end{cases},$$

where $$f^T \cdot z = [\underbrace{0 \ldots 0}_{m*n} \quad \underbrace{1 \ldots 1}_{w*m} \quad \underbrace{1 \ldots 1}_{w*m}] \times z,$$

$$l_z = \begin{bmatrix} -\varepsilon \\ \vdots \\ -\varepsilon \\ 0 \\ \vdots \\ 0 \end{bmatrix}$$

and $$u_z = \begin{bmatrix} 1+\varepsilon \\ \vdots \\ 1+\varepsilon \\ +\infty \\ \vdots \\ +\infty \end{bmatrix},$$

with ε between 0 and 0.5;

each feeder comprises one or more electrical phase conductors, and, during the acquiring step b), the second data are acquired for each electrical phase conductor and relate to the electrical power delivered by each electrical phase conductor, and, during the determining step f), the connection parameters determined comprise for each electricity consumer an identifier of the electrical phase conductor or conductors to which it is connected;

during the determining step f), the method comprises the following steps:
f1) pseudo-random selecting of a third set of classes of data included in the first set,
f2) determining the connection parameters from the third set selected from the first set;

following the selecting step f1) and prior to the determining step f2), the method comprises the following steps:
f3) calculating a repetition parameter, f4) determining, from the third selected set, intermediate connection indices comprising for each electricity consumer an identifier of the feeder to which it is connected, f5) storing the intermediate connection indices, and f6) comparing the repetition parameter with at least one predetermined repetition criterion, and, following the result of the comparing step f6), performing a step from, on the one hand, the repetition of the steps of selecting f1), calculating f3), determining f4), storing f5) and comparing f6) and, on the other hand, the step of determining f2) the connection parameters on the basis of the stored intermediate connection indices;

the method comprises the following step:

f7) calculating, for each consumer and for each feeder an assignment number relating to the number of times that the stored intermediate connection indices indicate that the consumer is connected to the feeder, and, during the determining step f2), the connection parameters are determined from the assignment numbers calculated.

The subject matter of the invention is also a computer program comprising software instructions, which when they are executed by a computer, implement the method as defined above.

The subject matter of the invention further relates to a system for determining the structure of an electricity transmission grid, the transmission grid comprising a power supply station comprising one or more feeders for supplying electrical power to a plurality of electricity consumers, the system comprising:

for each electricity consumer, a first sensor for measuring first data relating to the electrical power consumed by the consumer during various time intervals, for each feeder, a second sensor for measuring second data relating to the electrical power delivered by the feeder during the various time intervals, a module for acquiring the first and second data, a module for generating a plurality of different classes of data, each associated with one of the time intervals, each class of data comprising the first and second data associated with said time interval, characterized in that said determining system further comprises:

a module for calculating a first selection criterion for each class of data, the first selection criterion being a criterion chosen from an overall rate of electrical power losses between the feeder or feeders and the consumers and a difference in consumption of electrical power between the various consumers, a module for selecting, on the basis of the first selection criteria calculated, a first set of classes of data from the classes generated, and a module for determining, from the first selected set, connection parameters, said parameters comprising for each electricity consumer an identifier of the feeder to which it is connected.

The invention will be better understood and other advantages thereof will appear more clearly in the light of the following description, given solely as a non-restrictive example, and referring to the drawings, in which.

Figure 1:
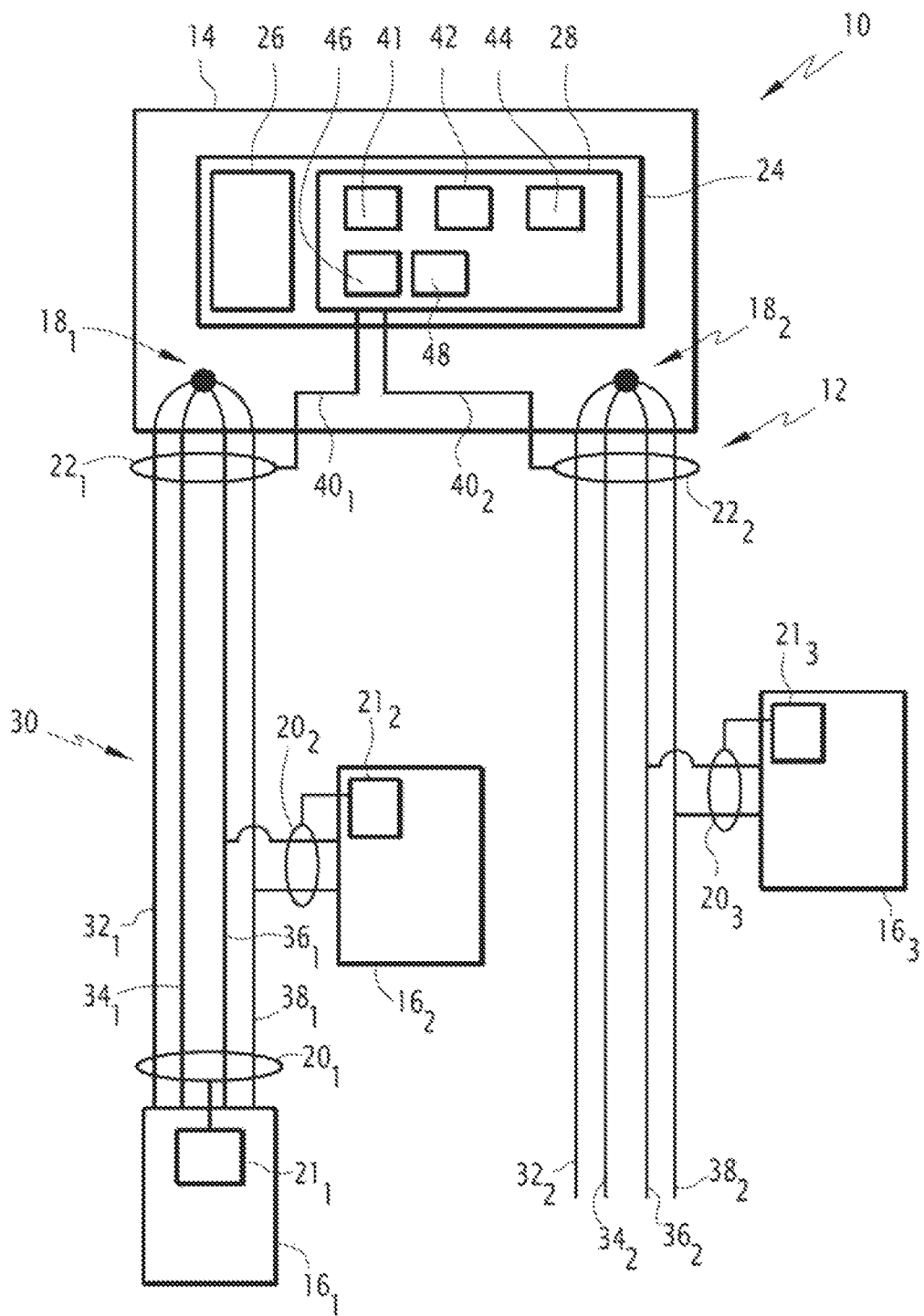
FIG. 1 is a schematic representation of an electricity transmission grid comprising a power supply station comprising a plurality of feeders for supplying electrical power to a plurality of electricity consumers.

In FIG. 1, an electricity transmission grid 10 is associated with a system 12 for determining the structure of the electricity transmission grid 10. The transmission grid 10 comprises a power supply station 14 for supplying electrical power to a plurality of electricity consumers $16_i$. The power supply station 14 comprises electrical feeders $18_j$ for supplying electrical power to electricity consumers $16_i$, with i an electricity consumer index and j a feeder index.

The electricity consumer index i varies from 1 to n, where n is the number of electricity consumers $16_i$ and the feeder index j varies from 1 to m, where m is the number of electrical feeders $18_j$. In the example of FIG. 1, the number n of electricity consumers $16_i$ is equal to 3, and the number m of electrical feeders $18_j$ is equal to 2.

The determining system 12 comprises, for each electrical consumer $16_i$, a first sensor $20_i$ for measuring power and a module $21_i$ for transmitting the power measurements performed by the corresponding first sensor $20_i$.

The determining system 12 comprises, for each feeder $18_j$, a second sensor $22_j$ for measuring power.

The determining system 12 also comprises an information processing unit 24 formed, for example, from a processor 26 and a memory 28 associated with the processor 26.

The power supply station 14 is, for example, a medium voltage/low voltage transformer station connected between a medium voltage grid, not represented, and a low voltage grid 30 corresponding to the electricity consumers $16_i$.

The power supply station 14 includes, at each feeder $18_j$, the corresponding second sensor $22_j$.

The electricity consumers $16_i$ are connected to the power supply station 14 via the feeders $18_j$. More precisely, in the example of FIG. 1, the electricity consumers $16_1$, $16_2$ are connected to the feeder $18_1$ and the electricity consumer $16_3$ is connected to the feeder $18_2$.

The electricity consumers $16_i$ are either three-phase and supplied with power by the corresponding feeder $18_j$ via four electrical conductors $32_j$, $34_j$, $36_j$, $38_j$, i.e. three electrical phase conductors $32_j$, $34_j$, $36_j$ and a neutral electrical conductor $38_j$, or single-phase and supplied with power by the corresponding feeder $18_j$ via two electrical conductors: i.e., for example, a phase conductor $32_j$, $34_j$ or $36_j$, and the neutral conductor $38_j$.

In the example in FIG. 1, the electricity consumer $16_1$ is three-phase and the electricity consumers $16_2$, $16_3$ are single-phase.

Each electricity consumer $16_i$ includes the corresponding one of the first sensors $20_i$ and the corresponding one of the transmission modules $21_i$.

Each electricity consumer $16_i$ is, for example, a communicating electricity consumption meter, appropriate for measuring the first data $E_{Ci}$ relating to the electrical power consumed by the electricity consumer $16_i$, via the corresponding first sensor $20_i$, and transmitting the first data $E_{Ci}$ to the processing unit 24 via the corresponding transmission module $21_i$.

Each feeder $18_j$ is a three-phase feeder and comprises the corresponding three phase conductors $32_j$, $34_j$, $36_j$ and the corresponding neutral conductor $38_j$. As a variant, not represented, the electrical feeders are single-phase and comprise one phase conductor and one neutral conductor. According to yet another variant, not represented, some feeders are single-phase and others are three-phase.

Each first sensor $20_i$ is appropriate for measuring the first data $E_{Ci}(t_l)$ relating to the electrical power consumed by the corresponding electricity consumer $16_i$, during various time intervals $t_l$.

More generally, the first sensors $20_i$ are configured for measuring the first data $E_{Ci}(t_l)$ during the same time intervals $t_l$, the first data $E_{Ci}(t_l)$ measured at each electricity consumer $16_i$ being measured synchronously.

Each transmission module $21_i$ is appropriate for transmitting the first data $E_{Ci}(t_l)$ measured by the corresponding first sensor $20_i$ to the processing unit 24.

Advantageously, each transmission module $21_i$ is appropriate for transmitting with the first data $E_{Ci}(t_l)$ a first item of information relating to the time interval during which the first data were measured.

Each second sensor $22_j$ is appropriate for measuring the second data $E_{Dj}(t_l)$ relating to the electrical power delivered by the corresponding feeder $18_j$, during the various time intervals $t_l$.

The first $E_{Ci}(t_l)$ and second $E_{Dj}(t_l)$ data measured are then synchronized in the direction in which they are measured during identical time intervals $t_l$.

Each second sensor $22_j$ is also configured for transmitting, via a respective electrical link $40_j$, the second data $E_{Dj}(t_l)$ that it measures to the processing unit 24.

Advantageously, each second sensor $22_j$ is configured for transmitting with the second data $E_{Dj}(t_l)$ a second item of information relating to the time interval $t_l$ during which the second data $E_{Dj}(t_l)$ were measured.

The first $E_{Ci}(t_l)$ and second $E_{Dj}(t_l)$ data are, for example, active power measurements.

More precisely, in the rest of the description, it is considered that the first $E_{Ci}(t_l)$ and second $E_{Dj}(t_l)$ data are active power measurements.

As a variant, the first $E_{Ci}(t_l)$ and second $E_{Dj}(t_l)$ data are reactive energy measurements, apparent energy measurements, active power measurements, reactive power measurements, apparent power measurements or even current measurements.

The processor 26 is configured for running software comprised in the memory 28.

The memory 28 comprises software 41 for acquiring the first $E_{Ci}(t_l)$ and second $E_{Dj}(t_l)$ data, software 42 for generating a plurality of different classes of data $Je_l$ from the first data $E_{Ci}(t_l)$ and the second data $E_{Dj}(t_l)$ acquired in a same time interval $t_l$ and software 44 for calculating a first selection criterion $C1_l$ for each class of data $Je_l$.

The memory 28 also comprises software 46 for selecting a first set $En_1$ of classes of data $Je_l$, on the basis of the first selection criteria $C1_l$ calculated by the calculation software 44 and software 48 for determining connection parameters $a_{ij}$, said connection parameters comprising for each electricity consumer $16_i$ an identifier of the feeder $18_j$ to which it is connected.

The acquisition 41, generation 42, calculation 44, selection 46 and determination 48 software correspond to software instructions and form a computer program capable of being run by a computer. The computer corresponds, for example, to the processing unit 24.

The acquisition software 41 is appropriate, for example, for transmitting to each electricity consumer $16_i$ and notably to each first sensor $20_i$ an order to measure first data $E_{Ci}(t_l)$ and an order to transmit first data $E_{Ci}(t_l)$, in order to retrieve the first data.

Similarly, the acquisition software 41 is, for example, configured for transmitting to each feeder $18_j$ and notably to each second sensor $22_j$ an order to measure second data $E_{Dj}(t_l)$ and an order to transmit second data $E_{Dj}(t_l)$, in order to retrieve the second data $E_{Dj}(t_l)$.

Advantageously the orders to measure first $E_{Ci}(t_l)$ and second $E_{Dj}(t_l)$ data are transmitted simultaneously to all the feeders $18_j$ and all the consumers $16_i$.

The generation software 42 is configured for generating classes of data $Je_l$ which are each associated with one of the time intervals $t_l$ and which comprise the first $E_{Ci}(t_l)$ and second $E_{Dj}(t_l)$ data associated with said time interval $t_l$. In other words, the generation software 42 selects the first $E_{Ci}(t_l)$ and second $E_{Dj}(t_l)$ data measured during the various time intervals $t_l$, for creating the classes of data $Je_l$.

The calculation software 44 is suitable for calculating, for each class of data $Je_l$, the first selection criterion $C1_l$, which is chosen from an overall rate of electrical power losses between the feeders $18_j$ and the electricity consumers $16_i$ and a difference in consumption of electrical power between the various consumers $16_i$. The electrical power losses include both 'technical' losses, e.g. losses linked to Joule losses during the flow of the current between the feeders $18_j$ and the consumers $16_i$, and 'non-technical' losses, which are, for example, linked to electricity theft, owing to the fact that consumers are connected to the transmission grid 10 without the information processing unit 24 being informed thereof and to defective first sensors $20_i$.

If the first selection criterion $C1_l$ is, for example, the overall rate of electrical power losses between the feeders $18_j$ and the consumers $16_i$, the first selection criterion $C1_l$ is calculated from the following formula:

$$C1_l = \frac{\Delta E}{E}(t_l) = \frac{\sum_{j=1}^{m} E_{Dj}(t_l) - \sum_{i=1}^{n} E_{Ci}(t_l)}{\sum_{j=1}^{m} E_{Dj}(t_l)}, \quad (1)$$

where l is a class of data index and varies from 1 to r, r being the number of classes of data generated by the generation software 42, $t_l$ is the time interval associated with the class of data of index I, $E_{Ci}(t_l)$ is the electrical power consumed by the electricity consumer of index i during the time interval $t_l$ and $E_{Dj}(t_l)$ is the electrical power delivered by the feeder of index j during the time interval $t_l$.

If the first selection criterion $C1_l$ is, for example, the relative difference in consumption of electrical power between the various consumers $16_i$, the first selection criterion $C1_l$ is calculated from the following formula:

$$C1_l = \text{Var}(E_{C1}(tk), \ldots, E_{Cn}(tk)), \quad (2)$$

where Var is the variance function.

As a variant, if the first selection criterion $C1_l$ is, for example, the difference in consumption of electrical power between the various consumers, the first selection criterion $C1_l$ is calculated from the following formula:

$$C1_l = \frac{\text{Var}(E_{C1}(tk), \ldots, E_{Cn}(tk))}{\text{Moy}(E_{C1}(tk), \ldots, E_{Cn}(tk))}, \quad (3)$$

where Moy is a mean function, such as an arithmetic, geometric, quadratic, etc. mean.

The selection software 46 is configured for selecting the first set $En_1$ of classes of data from the classes of data $Je_l$ generated by the generation software 42, on the basis of the first selection criteria $C1_l$ calculated. The selection software 46 is, for example, configured for comparing the first criteria $C1_l$ with a first predetermined variable V1 and for selecting the classes of data $Je_l$ for which the first criterion $C1_l$ is less than the first predetermined variable V1.

The determination software 48 is configured for determining the connection parameters $a_{ij}$ from the first selected set $En_1$.

The determination software 48 is, for example, configured for establishing or determining an equation system to be solved from a premise of conservation of electrical power for each feeder $18_j$, according to which the power delivered by the feeder $18_j$ is substantially equal to the sum of the power consumed by the electricity consumers $16_i$ connected to the feeder $18_j$ and the electrical losses.

The equation system is, for example, defined from the following equation:

$$E_{Dj}(t_k) = \sum_{i=1}^{n}(a_{ij} \cdot E_{Ci}(t_k) + \partial 1_{jk} - \partial 2_{jk}) \quad (4)$$

where n is the number of electricity consumers, j is a feeder index varying from 1 to m, m being the number of feeders,
i is an electricity consumer index varying from 1 to n,
k is a class of data index $Je_k$ of the first set $En_1$ varying from 1 to w, w being the number of classes of data $Je_k$ of the first set $En_1$, $t_k$ is the time interval associated with the class of data $Je_k$ of index k,
$a_{ij}$ is the connection parameter indicating whether the consumer of index i is connected to the feeder of index j,
$E_{Ci}(t_k)$ is the electrical power consumed by the electricity consumer of index i during the time interval $t_k$,
$E_{Dj}(t_k)$ is the electrical power delivered by the feeder of index j during the time interval $t_k$, and
$\partial 1_{jk}$ and $\partial 2_{jk}$ are adjustment variables representative of the electrical losses, i.e. of the difference for each class of data $Je_k$ and for each feeder $18_j$ between the electrical power delivered by the feeder $18_j$ and the electrical power consumed by the electricity consumers $16_i$ connected to the feeder of index j.

The equation system is then written, for example, in matrix form as follows:

$$A * z = B, \quad (5)$$

where $$z = \begin{bmatrix} a_{11} \\ \vdots \\ a_{n1} \\ \vdots \\ a_{1m} \\ \vdots \\ a_{nm} \\ \partial 1_{11} \\ \vdots \\ \partial 1_{mw} \\ \partial 2_{11} \\ \vdots \\ \partial 2_{mw} \end{bmatrix},$$

$$B = \begin{bmatrix} E_{D1}(t_1) \\ \vdots \\ E_{D1}(t_w) \\ E_{D2}(t_1) \\ \vdots \\ E_{D2}(t_w) \\ E_{Dm}(t_1) \\ \vdots \\ E_{Dm}(t_k) \end{bmatrix}$$

and
$$A = [\, D \quad I_{w*m} \quad -I_{w*m}\,],$$

$I_{w*m}$ representing the unity matrix of size w*m, with $$D = \begin{bmatrix} U & 0 & \cdots & 0 \\ 0 & \ddots & \ddots & \vdots \\ \vdots & \ddots & \ddots & 0 \\ 0 & \cdots & 0 & U \end{bmatrix},$$

$$U = \begin{bmatrix} E_{C1}(t_1) & \cdots & E_{Cn}(t_1) \\ \vdots & \ddots & \vdots \\ E_{C1}(t_w) & \cdots & E_{Cn}(t_w) \end{bmatrix}$$

and D comprising m*n columns and m*w rows.

The determination software 48 is then configured for solving the equation system from an optimization algorithm verifying:

$$\min_z f^T \cdot z$$

such that $$\begin{cases} A \cdot z = B \\ 1_z \leq z \leq u_z \end{cases}, \quad (6)$$

where $$f^T \cdot z = [\underbrace{0 \ldots 0}_{m*n} \quad \underbrace{1 \ldots 1}_{w*m} \quad \underbrace{1 \ldots 1}_{w*m}] \times z,$$

$f^T$ corresponding to a cost function of the optimization algorithm and z to an objective vector defined above and where, $$l_z = \begin{bmatrix} -\varepsilon \\ \vdots \\ -\varepsilon \\ 0 \\ \vdots \\ 0 \end{bmatrix},$$

$l_z$ being of dimension m*n+2*w*m and comprising m*n times the value $-\varepsilon$ and 2*w*m times the value 0 and $$u_z = \begin{bmatrix} 1+\varepsilon \\ \vdots \\ 1+\varepsilon \\ +\infty \\ \vdots \\ +\infty \end{bmatrix},$$

$u_z$ being of dimension m*n+2*w*m and comprising m*n times the value (1+ε) and 2*w*m times the value +∞, with ε between 0 and 0.5, preferably between 0 and 0.1, preferably still equal to 0.05.

The optimization algorithm is appropriate for determining the objective vector z and therefore the connection parameters for which the function $f^T.z$ is minimized. More precisely, the determination software 48 is configured for starting from an initial vector solution $$X = \begin{bmatrix} a_{11} \\ \vdots \\ a_{nm} \end{bmatrix}$$

chosen randomly and for iteratively converging towards a solution. At each iteration, the adjustment variables $\partial 1_{jk}$, $\partial 2_{jk}$ and the function $f^T.z$ are calculated and can be used to decide the next vector solution X.

More precisely, at each iteration, the optimization algorithm balances the power differences with the adjustment variables $\partial 1_{jk}$, $\partial 2_{jk}$ so that the equalities of the equation system are verified. Thus, if the power delivered on a feeder of index j shows a surplus, the corresponding adjustment variable $\partial 1_{jk}$ is increased and if this power shows a deficit, the corresponding variable $\partial 2_{jk}$ is increased. Thus, the more the connection parameters $a_{ij}$ comply with the principle of conservation of power, the lower the adjustment variables are. The objective is to minimize the adjustment variables, resulting in the objective function $$f^T \cdot z = \sum_{j=1}^{m} \sum_{k=1}^{w} (\partial 1_{jk} + \partial 2_{jk}).$$

The matrices $l_z$ and $u_z$ bound the connection parameters $a_{ij}$ between −ε and 1+ε and the adjustment variables $\partial 1_{jk}$ and $\partial 2_{jk}$ between 0 and +∞. More precisely, during the application of the optimization algorithm, the connection parameters $a_{ij}$ are real numbers allowing the constraints to be relaxed. Then, following the application of the optimization algorithm, the determination software 48 is configured for setting the values of the connection parameters $a_{ij}$ to 0 or to 1 on the basis of their value following the application of the optimization algorithm. The value 0 indicates a non-connection of the consumer of index i to the feeder of index j, while the value 1 indicates a connection of the consumer of index i to the feeder of index j.

The determination software 48 is, for example, configured for determining the values of the connection parameters following the application of the optimization algorithm via the following equation:

$$a_{ij} = \begin{cases} 1 & \text{if } a_{ij} = \max_j(a_{ij}) \\ 0 & \text{else} \end{cases} \quad (7)$$

Thus, according to equation (7) above, each consumer $16_i$ is connected to a single feeder $18_j$.

In addition, the processing unit 24 is configured for identifying, on the basis of the connection parameters determined and from, for example, identification software, not represented, comprised in the memory 28, subsets of consumers, with each subset of consumers that corresponds to the set of consumers $16_i$ connected to a same feeder $18_j$.

As a variant, the determination software 48 is configured for determining the connection parameters separately for each feeder and independently of the second data relating to the electrical power acquired for the other feeders.

According to this variant, an optimal equation system is determined for each feeder, and the optimization algorithm is applied to each optimal equation system. Thus m optimal equation systems are obtained, solved independently via the optimization algorithm.

Thus, for the feeder of index 1, the corresponding optimal equation system verifies:

$$A1*z1=B1, \quad (8)$$

where $$z1 = \begin{bmatrix} a_{11} \\ \vdots \\ a_{n1} \\ \partial 1_{11} \\ \vdots \\ \partial 1_{1w} \\ \partial 2_{11} \\ \vdots \\ \partial 2_{1w} \end{bmatrix}, B1 = \begin{bmatrix} E_{D1}(t_1) \\ \vdots \\ E_{D1}(t_w) \end{bmatrix} \text{ and } A1 = [U \quad I_w \quad -I_w],$$

with $$U = \begin{bmatrix} E_{C1}(t_1) & \cdots & E_{Cn}(t_1) \\ \vdots & \ddots & \vdots \\ E_{C1}(t_w) & \cdots & E_{Cn}(t_w) \end{bmatrix}.$$

Then, according to this variant, the determination software 48 is, for example, appropriate for determining the values of the connection parameters via equation (7).

According to another variant, the determination software 48 is configured for determining the connection parameters for each electrical phase conductor $32_j$, $34_j$, $36_j$ and not simply for each feeder $18_j$. According to this other variant, the equation system then comprises as many equations as electrical phase conductors $32_j$, $34_j$, $36_j$ and the variables described above and relating to a specific feeder j then relate to a specific phase conductor. Thus, the second sensors $22_j$ measure the electrical power delivered by each phase conductor $32_j$, $34_j$, $36_j$ and not each feeder $18_j$, the connection parameters $a_{ij}$ are determined for each phase conductor $32_j$, $34_j$, $36_j$ and the adjustment variables are determined for each phase conductor $32_j$, $34_j$, $36_j$. According to this other variant, each electrical conductor is identified, for example, by an index and the variable j, set out in the equations above, then corresponds to an electrical phase conductor index varying from 1 to u, with u the number of electrical phase conductors which is equal to 3*m, or 6 in the example of FIG. 1.

Several embodiments of a method for determining the structure of the electricity transmission grid 10, implemented via the processing unit 24, and more generally via the determination system 12, will now be described.

Figure 2:
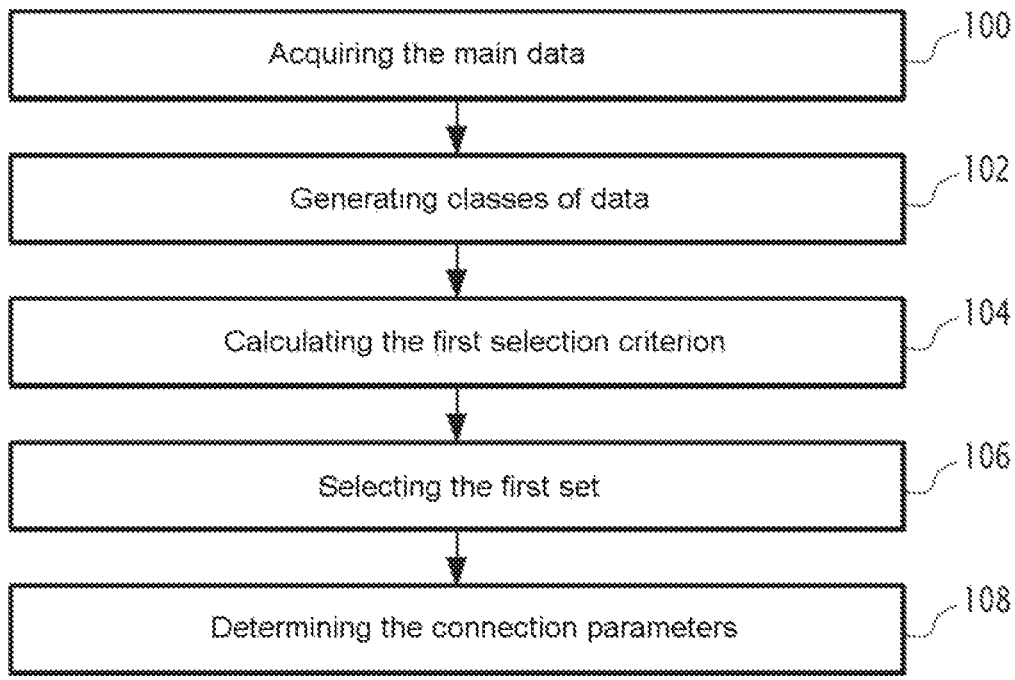
FIG. 2 is a flow chart of a method for determining the structure of the electricity transmission grid in FIG. 1, according to a first embodiment of the invention.

According to a first embodiment described below with reference to FIG. 2, the method comprises an initial step 100 of acquiring main data for the transmission grid 10. The main data comprise, for example, the total number n of consumers $16_i$, the total number m of feeders $18_j$, the first data $E_{Ci}(t_l)$ measured, the second data $E_{Dj}(t_l)$ measured and the various time intervals $t_l$ associated with the first and second data measured. Indeed, during the initial step 100, the acquisition software 41 controls, for example, the measurement, by each first $20_j$ and each second $22_j$ sensor, of the first $E_{Ci}(t_l)$ and second $E_{Dj}(t_l)$ data during the time intervals $t_l$ and the transmission of the first $E_{Ci}(t_l)$ and second $E_{Dj}(t_l)$ data which are then associated with the time interval $t_l$ during which they were measured, via, for example, the first and second information.

Subsequently, during a generating step 102, the generation software 42 generates a plurality of different classes of data $Je_l$, each associated with one of the time intervals $t_l$ and which comprise the first $E_{Ci}(t_l)$ and second $E_{Dj}(t_l)$ data associated with said time interval $t_l$.

Then, during a calculating step 104, the calculation software 44 calculates the first selection criterion $C1_l$ for each class of data $Je_l$. The first selection criterion $C1_l$ is, for example, the overall rate of electrical power losses between the feeders $18_j$ and the consumers $16_i$.

Subsequently, during a selecting step 106, the selection software 46 selects the first set $En_1$ on the basis of the first selection criteria $C1_l$ calculated. The first set $En_1$ is selected from the classes of data generated in step 102. In the course of the selecting step 106, the selection software 46 compares, for example, the first criteria $C1_l$ with the first predetermined variable V1, the value of the first predetermined variable V1 being defined, for example, during the acquiring step 100. The selection software 46 then selects the classes of data $Je_l$ for which the first criterion $C1_l$ is less than the first predetermined variable V1.

Finally, during a determining step 108, the connection parameters are determined via the determination software 48 and from the first selected set $En_1$.

More precisely, the determination software 48 determines the equation system to be solved from, for example, equation (4), as set out above. Then, as set out above during the description of the determining system 12 and equation (5), the optimization algorithm is applied to the equation system in order to determine the connection parameters $a_{ij}$.

As a variant, during the determining step, the determination software 48 determines the optimal equation systems, as set out above via equation (8), and applies the optimization algorithm to each optimal equation system. The speed of determining the connection parameters $a_{ij}$ is then improved, since the optimal equation systems comprise a limited number of equations.

In the first embodiment, the fact of selecting classes of data $Je_k$ eliminates the classes of data $Je_l$ for which the losses are the greatest, since these classes of data risk leading to an erroneous determination of the connection parameters $a_{ij}$.

Thus, according to the first embodiment, the determined connection parameters $a_{ij}$, are determined with more certainty compared with the methods known in the prior art and the reliability of the method of determination is improved.

In addition, the optimization algorithm used enables any number of classes of data $Je_k$ to be used during the determining step 108, even if it is preferable that the number of classes of data of the first set is greater than or equal to the total number n of consumers $16_i$.

Figure 3:
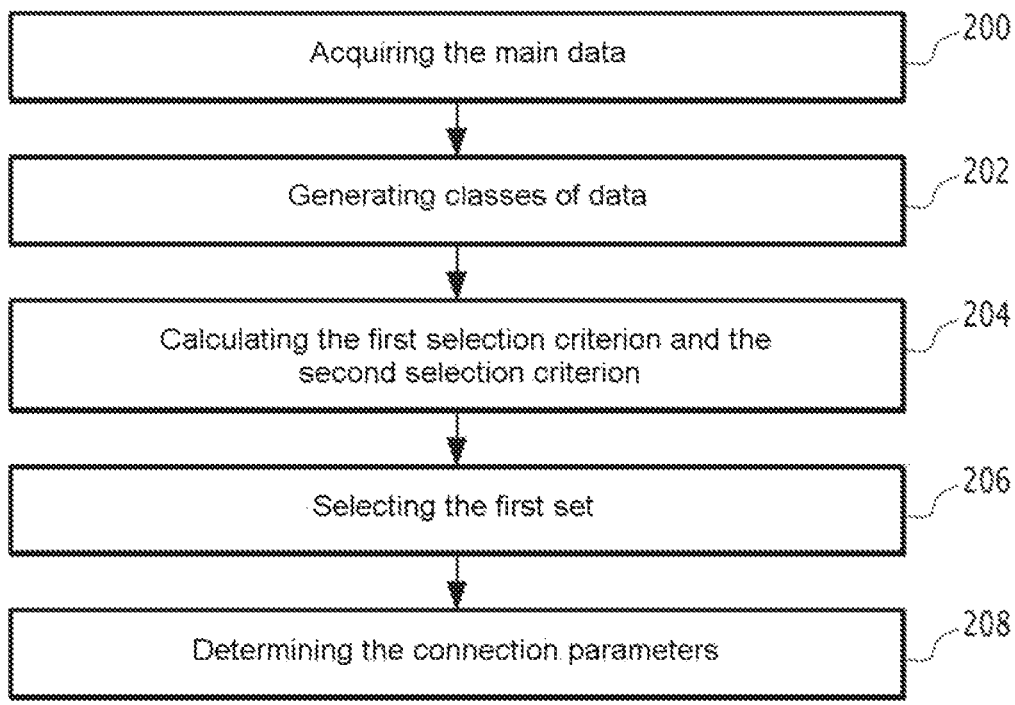
FIG. 3 is a flow chart similar to that in FIG. 2, according to a second embodiment of the invention.

According to a second embodiment of the invention described below with reference to FIG. 3, the method comprises steps 200, 202, 204, 206, 208 respectively identical to steps 100, 102, 104, 106, 108 of the first embodiment and, during step 204, a second selection criterion $C2_l$ is calculated for each class of data generated. The second selection criterion $C2_l$ is different from the first criterion $C1_l$ and is chosen from an overall rate of electrical power losses between the feeder or feeders and the consumers and a difference in consumption of electrical power between the various consumers.

Thus, during step 204, each first criterion $C1_l$ is, for example, the overall rate of loss relating to the corresponding class of data $Je_l$ and each second criterion $C2_l$ is the difference in electrical consumption relating to the corresponding class of data $Je_l$, and is calculated via equation (2) or equation (3).

Then, in the course of the selecting step 206, the selection software 46 selects the first set $En_1$ on the basis of the first selection criteria $C1_l$ and the second selection criteria $C2_l$ calculated. The first set $En_1$ is selected from the classes of data generated in step 202. In the course of the selecting step 206, the selection software 46 compares, for example, the first criteria $C1_l$ with the first variable V1 and the second criteria $C2_l$ with a second predetermined variable V2. The value of the second predetermined variable V2 is, for example, defined during the acquiring step 200. The selection software 46 then selects the classes of data for which the first criterion $C1_l$ is less than the first predetermined variable V1 and the second criterion $C2_l$ is less than the second predetermined variable V2.

Finally, in the course of the determining step 208 the connection parameters are determined via the determination software 48 and from the first selected set $En_1$.

The second embodiment makes it possible to refine the selection of the classes of data compared with the first embodiment and thus to select classes of data from which the risk of error in determining the connection parameters $a_{ij}$ is minimized. The accuracy, speed and reliability of the method of determination are thus improved.

Figure 4:
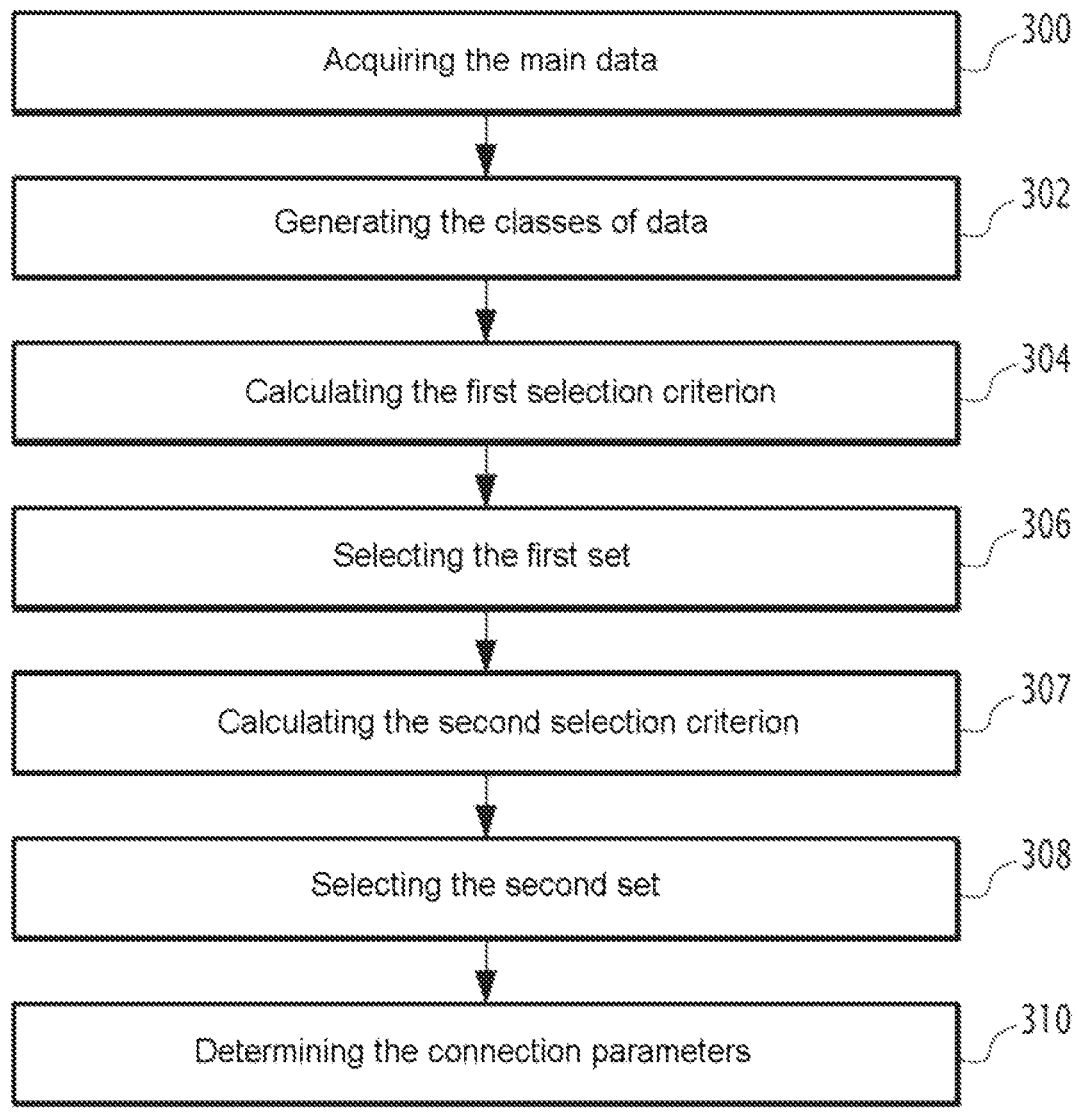
FIG. 4 is a flow chart similar to that in FIG. 2, according to a third embodiment of the invention.

According to a third embodiment of the invention described below with reference to FIG. 4, the method comprises steps 300, 302, 304, 306, 310 respectively identical to steps 100, 102, 104, 106, 108 of the first embodiment and, following step 306 and prior to step 310, the method comprises a step 307 of calculating a second selection criterion $C2_k$ for each class of data of the first set $En_1$, the second criterion $C2_k$ being different from the first criterion and being chosen from an overall rate of electrical power losses between the feeder or feeders $18_j$ and the consumers $16_i$ and a difference in electrical power consumption between the different consumers $16_i$.

In the third embodiment, each first criterion $C1_l$ is, for example, the overall rate of loss relating to the corresponding class of data generated in step 302 and each second criterion $C2_k$ is the difference in electrical consumption relating to the corresponding class of data of the first set $En_1$.

Following the calculating step 307, during a selecting step 308, a second set $En_2$ of classes of data is selected from the first set $En_1$. Then, the first set $En_1$ is, for example, set equal to the second selected set $En_2$ for performing the determining step 310 on the basis of the second selected set $En_2$.

The third embodiment makes it possible to refine the selection of the classes of data compared with the first embodiment and thus to select classes of data from which the risk of error in determining connection parameters $a_{ij}$ is minimized. The accuracy, speed and reliability of the method of determination are thus improved.

Figure 5:
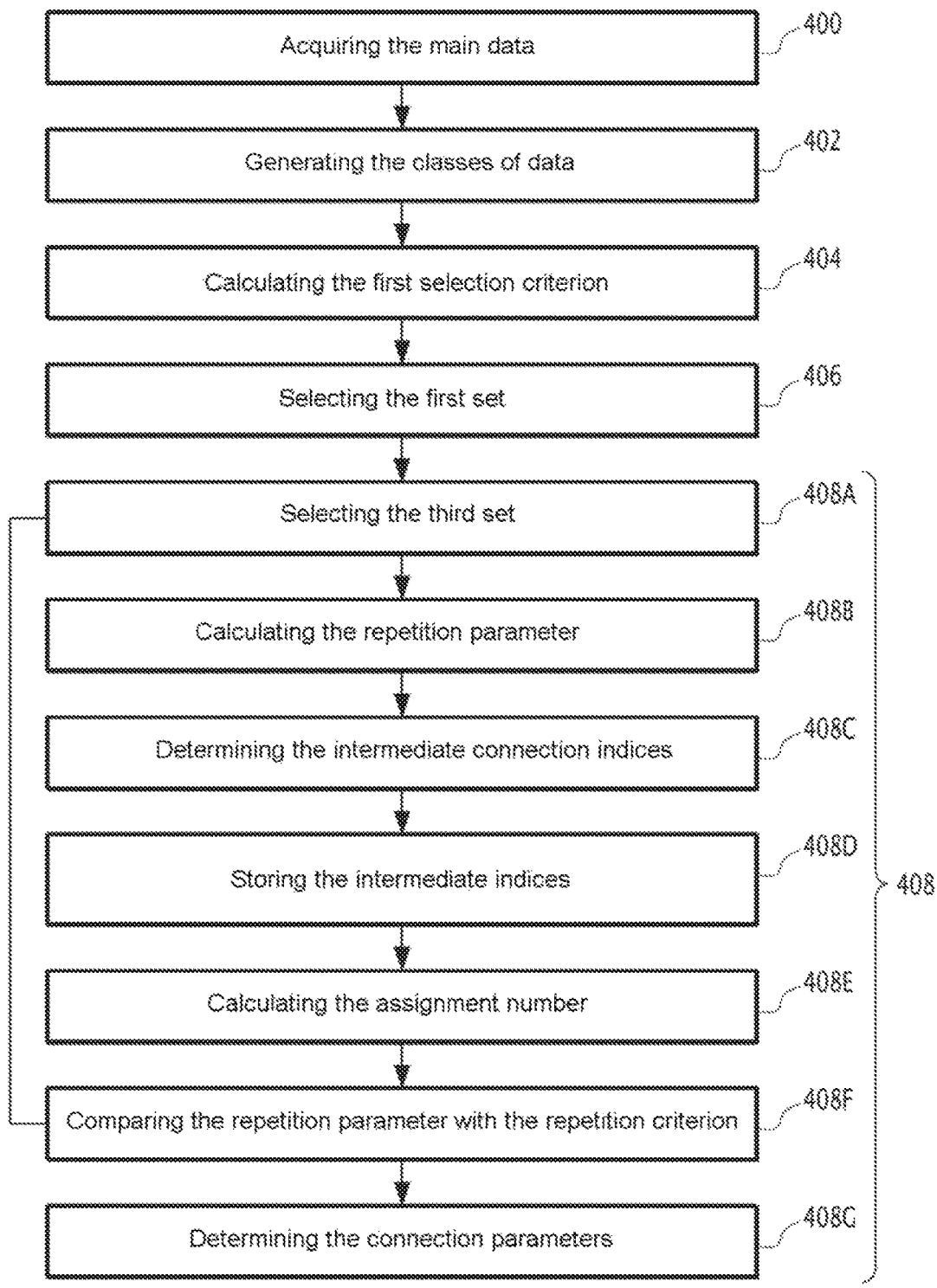
FIG. 5 is a flow chart similar to that in FIG. 2, according to a fourth embodiment of the invention.

According to a fourth embodiment of the invention described below with reference to FIG. 5, the method comprises steps 400, 402, 404, 406 respectively identical to steps 100, 102, 104, 106 of the first embodiment.

Then, following the selecting step 406, the method comprises a step 408 for determining the connection parameters. More precisely, during step 408, the method comprises a first substep 408A for pseudo-randomly selecting a third set $En_3$ of classes of data included in the first set $En_1$.

Subsequently, during a calculating substep 408B, a repetition parameter R1 is calculated. The repetition parameter R1 corresponds to a number of iterations of the selecting substep 408A.

Then, during a determining substep 408C, intermediate connection indices $b_{ij}$, indicating for each consumer $16_i$ the feeder $18_j$ to which it is connected, are determined from the third selected set $En_3$. More generally, the intermediate indices $b_{ij}$ comprise for each electrical consumer $16_i$ an identifier of the feeder $18j$ to which it is connected. The determining substep 408C is similar to the determining step 108 of the first embodiment, but is performed from the third set $En_3$.

Subsequently, during a storing substep 408D, the intermediate connection indices $b_{ij}$ are stored by the memory 28.

Then, in the course of a calculating substep 408E, performed for each consumer $16_i$ and for each feeder $18_j$, an assignment number $NA_{ij}$ relating to the number of times that the stored intermediate connection indices indicate that the consumer $16_i$ is connected to the feeder $18_j$ is calculated.

The assignment number $NA_{ij}$ is, for example, calculated via the following formula:

$$NA_{ij} = \frac{N(b_{ij} = 1)}{N_T},$$

where $N(b_{ij}=1)$ corresponds to the number of times that the stored intermediate indices $b_{ij}$ are equal to 1 for the consumer $16_i$ of index i and the feeder $18_j$ of index j and $N_T$ corresponds to a total number of iterations of the selecting substep 408 A. Advantageously, the total number of iterations $N_T$ is initialized to 0 prior to the execution of the selecting substep 408A and incremented by 1 for each execution of the selecting substep.

It should be noted that the number of intermediate connection indices stored for a given electricity consumer $16_i$ and a given feeder $18_j$ is equal to the number of iterations of the selecting substep 408A.

Advantageously, the assignment numbers calculated are stored following the calculating substep 408E.

Then, during a comparing substep 408F, the repetition parameter R1 is compared to a predetermined repetition criterion CR1. The predetermined repetition criterion CR1 is, for example, initialized during the acquiring step 400.

The repetition criterion CR1 is, for example, a minimum number of iterations of the selecting substep 408A.

If during the comparing substep 408F, the repetition parameter is less than the repetition criterion, then the steps of selecting 408A, calculating 408B, determining 408C, storing 408D, calculating 408E and comparing 408F are repeated.

If during the comparing substep 408F, the repetition parameter R1 is greater than the repetition criterion CR1, then a substep 408G is performed for determining the connection parameters $a_{ij}$.

During the determining substep 408G, the connection parameters $a_{ij}$ are determined from the third selected set or sets $En_3$, and more precisely on the basis of the intermediate connection indices $b_{ij}$ stored during the storing substep 408D, and more precisely on the basis of the assignment numbers $NA_{ij}$ calculated at the last iteration of the substep 408E. More precisely, for each electricity consumer $16_i$, the feeder index j corresponding to the largest assignment number $NA_{ij}$ is identified, and the connection parameter $a_{ij}$ corresponding to said consumer $16_i$ and to said feeder $18_j$ is set equal to 1, the other connection parameters $a_{ij}$ relating to said consumer being set equal to 0.

Advantageously, if during the determining substep 408G all the assignment numbers relating to a consumer $16_i$ are less than a first predetermined threshold S1, e.g. equal to 0.6, then an error in identifying the connection for said consumer $16_i$ is identified.

As a variant, if the number of iterations of the substep 408A is greater than 2, then, during the calculating substep 408E, and at each iteration of the substep 408E, a first mean of the assignment numbers $NA_{ij}$, calculated at each iteration of the substep 408E, for each consumer $16_i$ and for each feeder $18_j$, is calculated. Then, a second mean of the assignment numbers $NA_{ij}$, calculated at the last iteration, for each consumer $16_i$ and for each feeder $18_j$, is calculated. Subsequently, during the substep 408E, a difference between the first mean and the second mean is calculated.

The first and the second mean are, for example, arithmetic, geometric, or quadratic, etc. means.

According to this variant, during the comparing substep 408F, the absolute value of the last difference calculated is compared to a second predetermined threshold S2, e.g. equal to 0.1. Then, if during the comparing substep 408F, the repetition parameter R1 is greater than the repetition criterion CR1 and the absolute value of the last difference calculated is less than the second threshold S2, then the substep 408G is performed. Else, steps 408A, 408B, 408C, 408D, 408E and 408F are reiterated.

The fourth embodiment makes it possible, notably when the number of iterations of the substep 408A is greater than 2, to determine the connection parameters $a_{ij}$ from third sets $En_3$ of different classes of data. Thus, the accuracy and reliability of the method of determination are improved.

In addition, the fourth embodiment advantageously makes it possible to identify each consumer $16_i$ for which the associated feeder $18_j$ is determined with a good index of confidence and each consumer $16_i$ for which the associated feeder $18_j$ is undetermined or determined with a poor index of confidence. Indeed, as described above, if during the determining substep 408G all the assignment numbers relating to a consumer $16_i$ are less than the first predetermined threshold S1, e.g. equal to 0.6, then an error in identifying the connection for said consumer $16_i$ is identified and the feeder $18_j$ to which the consumer $16_i$ is connected is undetermined. In the same way, if during the determining substep 408G an assignment number relating to a consumer $16_i$ is greater than a third predetermined threshold S3, e.g. equal to 0.95, then the connection of the consumer $16_i$ to the corresponding feeder $18_j$ is identified with a good index of confidence.

Advantageously again, the fourth embodiment makes it possible to associate, with each connection parameter $a_{ij}$, set equal to 1 during the determining substep 408G, an index of confidence representing the probability that the determined connection is correct. The index of confidence is, for example, equal to the corresponding assignment number $NA_{ij}$.

The embodiments and variants envisaged above are appropriate for being combined with each other, according to all technically acceptable combinations, for giving rise to other embodiments of the invention.

Thus, the second embodiment is appropriate for being combined with the fourth embodiment and the third embodiment is also appropriate for being combined with the fourth embodiment.

The invention claimed is:

1. A method for determining the structure of an electricity transmission grid, the method being implemented by computer, the transmission grid comprising a power supply station comprising one or more feeders for supplying electrical power to a plurality of electricity consumers, the method comprising:
   a) acquiring, for each of the plurality of electricity consumers, first data ($E_{Ci}(t_l)$) relating to the electrical power consumed by the electricity consumer during various time intervals ($t_l$), measured via a first sensor for measuring power;
   b) acquiring, for each of the one or more feeders, second data ($E_{Dj}(t_l)$) relating to the electrical power delivered by a corresponding feeder during the various time intervals ($t_l$), measured via a second sensor for measuring power;
   c) generating, via a processor, a plurality of different classes of data ($Je_l$), each associated with one of the time intervals, each of the classes of data ($Je_l$) comprising the first ($E_{Ci}(t_l)$) and second ($E_{Dj}(t_l)$) data associated with said time interval ($t_l$);
   d) calculating a first selection criterion ($C1_l$) for each of the classes of data, the first selection criterion ($C1_l$) being a criterion chosen from an overall rate of electrical power losses among the one or more feeders and the consumers and a difference in consumption of electrical power between the various consumers;
   e) selecting, by a selector and on the basis of the first selection criteria ($C1_l$) calculated, a first set ($En_1$) of classes of data ($Je_k$) from the classes generated ($Je_l$); and
   f) determining, from the first selected set ($En_1$), connection parameters ($a_{ij}$), said parameters ($a_{ij}$) comprising for each of the plurality of electricity consumers an identifier of the corresponding feeder to which it is connected,
   wherein the connection parameters are used to determine a structure of the electricity transmission grid in order to assess compliance of the electricity transmission grid with regulatory requirements.

2. The method according to claim 1,
   wherein, during the calculating step d), a second selection criterion ($C2_l$) is calculated for each of the classes of data ($Je_l$) generated, the second criterion ($C2_l$) being the other criterion chosen from an overall rate of electrical power losses between the one or more feeders and the consumers and a difference in consumption of electrical power between the various consumers, and
   wherein, during the selecting step e), the first set ($En_1$) is selected on the basis of the first ($C1_l$) and second ($C2_l$) criteria calculated.

3. The method according to claim 1, wherein following the selecting step e), the method comprises:
   e1) calculating a second selection criterion ($C2_l$) for each of the classes of data ($Je_k$) of the first set ($En_1$), the second criterion ($C2_l$) being the other criterion chosen from an overall rate of electrical power losses between the one or more feeders and the consumers and a difference in consumption of electrical power between the various consumers; and
   e2) selecting on the basis of the second selection criteria ($C2_l$) calculated, a second set ($En_2$) of classes of data from the first set ($En_1$), determining connection parameters ($a_{ij}$) then being performed during the determining step f) on the basis of the second set ($En_2$) selected from the first set ($En_1$).

4. The method according to claim 1, wherein, during the determining step f), the connection parameters ($a_{ij}$) are determined separately for each of the one or more feeders and independently of the second data ($E_{Dj}(t_l)$) relating to the electrical power acquired for the other feeders.

5. The method according to claim 1, wherein, during the determining step f), an equation system to be solved is determined from a premise of conservation of electrical power for each of the one or more feeders, according to which the power delivered by the feeder is substantially equal to the sum of the power consumed by the electricity consumers connected to the feeder and electrical losses.

6. The method according to claim 5, wherein, during the determining step f), the equation system is defined from the following equation:

$$E_{Dj}(t_k) = \sum_{i=1}^{n} (a_{ij} \cdot E_{Ci}(t_k) + \partial 1_{jk} - \partial 2_{jk}),$$

where:
   n is the number of electricity consumers, j is a feeder index varying from 1 to m, m being the number of feeders, i is an electricity consumer index varying from 1 to n,
   k is a class of data index ($Je_k$) of the first set ($En_1$) varying from 1 to w, w being the number of classes of data ($Je_k$) of the first set ($En_1$), $t_k$ is the time interval associated with the class of data $Je_k$ of index k,
   $a_{ij}$ is the connection parameter indicating whether the consumer of index i is connected to the feeder of index j,
   $E_{Ci}(t_k)$ is the electrical power consumed by the electricity consumer of index i during the time interval $t_k$,
   $E_{Dj}(t_k)$ is the electrical power delivered by the feeder of index j during the time interval $t_k$, and
   $\partial 1_{jk}$ and $\partial 2_{jk}$ are adjustment variables representative of the electrical losses.

7. The method according to claim 6, wherein the equation system is written in matrix form as follows: A*z=B, where $$z = \begin{bmatrix} a_{11} \\ \vdots \\ a_{n1} \\ \vdots \\ a_{1m} \\ \vdots \\ a_{nm} \\ \partial 1_{11} \\ \vdots \\ \partial 1_{mw} \\ \partial 2_{11} \\ \vdots \\ \partial 2_{mw} \end{bmatrix}, B = \begin{bmatrix} E_{D1}(t_1) \\ \vdots \\ E_{D1}(t_w) \\ E_{D2}(t_1) \\ \vdots \\ E_{D2}(t_w) \\ E_{Dm}(t_1) \\ \vdots \\ E_{Dm}(t_k) \end{bmatrix} \text{ and } A = \begin{bmatrix} U & 0 & \cdots & 0 \\ 0 & \ddots & \ddots & \vdots \\ \vdots & \ddots & \ddots & 0 \\ 0 & \cdots & 0 & U \end{bmatrix}$$

with $$U = \begin{bmatrix} E_{C1}(t_1) & \cdots & E_{Cn}(t_1) \\ \vdots & \ddots & \vdots \\ E_{C1}(t_w) & \cdots & E_{Cn}(t_w) \end{bmatrix}$$

and A comprising m*n columns and m*w rows.

8. The method according to claim 7, wherein, during the determining step f), an optimization algorithm is used for solving the equation system, the optimization algorithm verifying:

$$\min_z f^T \cdot z$$

such that $$\begin{cases} A \cdot z = B \\ l_z \le z \le u_z \end{cases},$$

where $$f^T \cdot z = \begin{bmatrix} \underbrace{0 \ldots 0}_{m*n} & \underbrace{1 \ldots 1}_{w*m} & \underbrace{1 \ldots 1}_{w*m} \end{bmatrix} \times z,$$

10 and $$l_z = \begin{bmatrix} -\varepsilon \\ \vdots \\ -\varepsilon \\ 0 \\ \vdots \\ 0 \end{bmatrix} \text{ and } u_z = \begin{bmatrix} 1+\varepsilon \\ \vdots \\ 1+\varepsilon \\ +\infty \\ \vdots \\ +\infty \end{bmatrix},$$

with ε between 0 and 0.5.

9. The method according to claim 1, wherein each of the one or more feeders comprises one or more electrical phase conductors, and wherein, during the acquiring step b), the second data ($E_{Dj}(t_j)$) are acquired for each of the electrical phase conductors and relate to the electrical power delivered by each of the electrical phase conductors and, during the determining step f), the connection parameters ($a_{ij}$) determined comprise for each of the plurality of electricity consumers an identifier of the electrical phase conductor or conductors to which it is connected.

10. The method according to claim 1, wherein, during the determining step f), the method comprises:
  f1) pseudo-random selecting of a third set ($En_3$) of classes of data included in the first set ($En_1$); and
  f2) determining connection parameters ($a_{ij}$) from the third set ($En_3$) selected from the first set ($En_1$).

11. The method according to claim 10, wherein, following the selecting step f1) and prior to the determining step f2), the method comprises:
  f3) calculating a repetition parameter (R1);
  f4) determining, from the third selected set ($En_3$), intermediate connection indices ($b_{ij}$) comprising for each of the plurality of electricity consumers an identifier of the feeder to which it is connected;
  f5) storing the intermediate connection indices ($b_{ij}$);
  f6) comparing the repetition parameter with at least one predetermined repetition criterion (CR1); and
  following the result of the comparing step f6), performing a step selected from, on the one hand, the repetition of the steps of selecting f1), calculating f3), determining f4), storing f5) and comparing f6) and, on the other hand, the step of determining f2) the connection parameters ($a_{ij}$) on the basis of the stored intermediate connection indices ($b_{ij}$).

12. The method according to claim 11, wherein the method further comprises:
  f7) calculating, for each of the plurality of electricity consumers and for each of the one or more feeders, an assignment number ($NA_{ij}$) relating to the number of times that the stored intermediate connection indices ($b_{ij}$) indicate that the consumer is connected to the feeder,
and
wherein, during the determining step f2), the connection parameters ($a_{ij}$) are determined from the assignment numbers ($NA_{ij}$) calculated.

13. A non-transitory computer-readable medium encoded with computer readable instructions, which when executed by a computer, cause the computer to perform the method according to claim 1.

14. A system for determining the structure of an electricity transmission grid, the transmission grid comprising a power supply station comprising one or more feeders for supplying electrical power to a plurality of electricity consumers, the system comprising:
  for each of the plurality of electricity consumers, a first sensor to measure first data ($E_{Ci}(t_j)$) relating to the electrical power consumed by the consumer during various time intervals ($t_j$);
  for each of the one or more feeders, a second sensor to measure second data ($E_{Dj}(t_j)$) relating to the electrical power delivered by the feeder during the various time intervals ($t_j$); and
  a processor to
  acquire first ($E_{Ci}(t_j)$) and second ($E_{Dj}(t_j)$) data,
  generate a plurality of different classes of data ($Je_l$), each associated with one of the time intervals ($t_j$), each of the classes of data ($Je_l$) comprising the first ($E_{Ci}(t_l)$) and second ($E_{Dj}(t_l)$) data associated with said time interval ($t_l$), caculate a first selection criterion ($C1_l$) for each of the classes of data ($Je_l$), the first selection criterion ($C1_l$) being a criterion chosen from an overall rate of electrical power losses between the one or more feeders and the consumers and a difference in consumption of electrical power between the various consumers, select, on the basis of the first selection criteria ($C1_l$) calculated, a first set ($En_1$) of classes of data ($Je_k$) from the classes generated, and determine, from the first selected set ($En_1$), connection parameters ($a_{ij}$), said parameters ($a_{ij}$) comprising for each of the plurality of electricity consumers an identifier of a corresponding feeder to which it is connected, wherein the connection parameters are used to determine a structure of the electricity transmission grid in order to assess compliance of the electricity transmission grid with regulatory requirements.

* * * * *